(12) United States Patent
Moitzi

(10) Patent No.: US 10,773,949 B2
(45) Date of Patent: Sep. 15, 2020

(54) METHOD OF MANUFACTURING AN ELECTRONIC DEVICE

(71) Applicant: AT&S Austria Technologie & Systemtechnik Aktiengesellschaft, Leoben (AT)

(72) Inventor: Heinz Moitzi, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/084,266

(22) PCT Filed: Mar. 14, 2017

(86) PCT No.: PCT/EP2017/055993
§ 371 (c)(1),
(2) Date: Sep. 12, 2018

(87) PCT Pub. No.: WO2017/157938
PCT Pub. Date: Sep. 21, 2017

(65) Prior Publication Data
US 2019/0062150 A1 Feb. 28, 2019

(30) Foreign Application Priority Data
Mar. 14, 2016 (DE) .................. 10 2016 104 676

(51) Int. Cl.
*B81B 7/00* (2006.01)
*B81C 1/00* (2006.01)
(Continued)

(52) U.S. Cl.
CPC ............ *B81B 7/0029* (2013.01); *B81B 7/007* (2013.01); *B81B 7/0074* (2013.01);
(Continued)

(58) Field of Classification Search
CPC ....... H01L 21/00; H01L 21/67; H01L 21/673; H01L 21/677; H01L 29/84; H01L 21/50;
(Continued)

(56) References Cited

U.S. PATENT DOCUMENTS 3,465,874 A * 9/1969 Hugle .................. H05K 13/003
206/714
3,785,895 A * 1/1974 Ettre ..................... H01L 21/705
156/89.12
(Continued)

FOREIGN PATENT DOCUMENTS

DE 10 2006 046 292 A1 4/2008
DE 11 2008 000 601 T5 12/2009
(Continued)

*Primary Examiner* — Carl J Arbes
(74) *Attorney, Agent, or Firm* — Robert A. Blaha; Smith Tempel Blaha LLC

(57) ABSTRACT

A method of manufacturing an electronic device includes providing a component carrier having a laminate of at least one electrically conductive layer structure and at least one electrically insulating layer structure, providing a mounting base for mounting an electronic component on and/or in the component carrier, and integrally forming a wall structure with the component carrier prior to mounting an electronic component on the mounting base, the integrally formed wall structure at least partially surrounding the mounting base for mounting the electronic component on the mounting base and protected by the wall structure.

11 Claims, 5 Drawing Sheets

(51) Int. Cl.
*H05K 1/18* (2006.01)
*H05K 3/30* (2006.01)

(52) U.S. Cl.
CPC ........ *B81C 1/0065* (2013.01); *B81C 1/00309* (2013.01); *H05K 1/181* (2013.01); *H05K 3/303* (2013.01); *B81C 2201/0188* (2013.01)

(58) Field of Classification Search
CPC ....... H01L 21/56; B81B 7/007; B81B 7/0029; B81B 7/0074; B81C 1/00309; B81C 1/0065; B81C 2201/0188; H05K 1/181; H05K 3/303
See application file for complete search history.

(56) References Cited

U.S. PATENT DOCUMENTS

| | | | | |
|---|---|---|---|---|
| 5,325,654 A | * | 7/1994 | Juntunen | H05K 13/0084 206/714 |
| 5,390,472 A | * | 2/1995 | Weiler | H05K 13/0084 53/412 |
| 5,472,085 A | * | 12/1995 | Gelzer | H05K 13/0084 206/714 |
| 5,648,136 A | * | 7/1997 | Bird | B65B 9/04 428/76 |
| 6,484,881 B1 | * | 11/2002 | Alvite | B65D 73/02 206/714 |
| 2012/0321111 A1 | | 12/2012 | Lillelund | |
| 2014/0117473 A1 | * | 5/2014 | Kierse | H01L 29/84 257/416 |
| 2014/0333011 A1 | * | 11/2014 | Javidan | B29C 64/40 264/401 |

FOREIGN PATENT DOCUMENTS

| | | |
|---|---|---|
| DE | 10 2014 106 220 A1 | 11/2015 |
| DE | 10 2014 113 990 A1 | 11/2015 |
| JP | 4045496 B * | 2/2008 |
| WO | WO2011076910 A1 | 6/2011 |

* cited by examiner

METHOD OF MANUFACTURING AN ELECTRONIC DEVICE

TECHNICAL FIELD

The invention relates to a method of manufacturing an electronic device, to an electronic device, and to a panel.

TECHNOLOGICAL BACKGROUND

Microelectromechanical systems (MEMS) is a technology that can be defined as miniaturized mechanical and electromechanical elements, including sensors and actuators, that are made using techniques of microfabrication. Critical physical dimensions of MEMS devices can vary from well below one micron to several millimeters. Types of MEMS devices can vary from relatively simple structures having no moving elements, to extremely complex electromechanical systems with multiple moving elements under the control of integrated microelectronics. In a MEMS, there may be at least some elements having some sort of mechanical functionality whether or not these elements can move.

Mounting MEMS devices on component carriers such as a printed circuit board involves technological issues since the sensitive MEMS devices need protection against external forces.

In a conventional procedure of manufacturing a component carrier such as a PCB with an electronic component such as a MEMS (microelectromechanical system) mounted thereon, the PCB manufacturer delivers the PCB to the MEMS customer. The MEMS customer then surface mounts the MEMS on the PCB and protects the PCB with regard to an environment by adhering a separate lid onto the PCB to cover and shield the surface mounted MEMS. This procedure of capping upon assembly is cumbersome.

SUMMARY

There may be a need to provide a simply manufacturable and simultaneously compact electronic device.

A method of manufacturing an electronic device, an electronic device, and a panel according to the independent claims are provided.

According to an exemplary embodiment of the invention, a method of manufacturing an electronic device is provided, wherein the method comprises providing a component carrier comprising a laminate of at least one electrically conductive layer structure and at least one electrically insulating layer structure, providing a mounting base for mounting an electronic component on and/or in the component carrier, and integrally forming a wall structure with the component carrier (in particular so that component carrier and wall structure form an integral body) prior to (or before) mounting an electronic component on the mounting base, the integrally formed wall structure at least partially surrounding the mounting base for mounting the electronic component on the mounting base and protected by the wall structure.

According to another exemplary embodiment of the invention, an electronic device is provided which comprises a component carrier configured as a laminate of at least one electrically conductive layer structure and at least one electrically insulating layer structure, a mounting base configured for mounting an electronic component on and/or in the component carrier, and a wall structure integrally formed with the component carrier and at least partially surrounding the mounting base for mounting the electronic component on the mounting base so that the electronic component, when mounted on the mounting base, is protected by the wall structure.

According to still another exemplary embodiment of the invention, a panel (in particular provided as an integral body) is provided which comprises a plurality of electronic devices having the above mentioned features (in particular with its mounting bases being free of electronic components thereon).

Overview of Embodiments

In the context of the present application, the term "electronic component" may particularly denote any active electronic component (such as an electronic chip, in particular a semiconductor chip) or any passive electronic component (such as a capacitor). Examples of electronic components are a data storage memory such as a DRAM (or any other memory), a filter (which may for instance be configured as a high pass filter, a low pass filter or a bandpass filter, and which may for instance serve for frequency filtering), an integrated circuit (such as a logic IC), a signal processing component (such as a microprocessor), a power management component, an optical electrically interfacing member (for instance an optoelectronic member), a voltage converter (such as a DC/DC converter or an AC/DC converter), a cryptographic component, a capacitor, an inductance, a switch (for instance a transistor-based switch) and a combination of these and other functional electronic members. Preferably, the electronic component is a MEMS (microelectromechanical system) such as a MEMS sensor or a MEMS actuator.

In the context of the present application, the term "integrally formed wall structure" may particularly denote that the wall structure and the component carrier form one single piece or integral body rather than being composed of two pre-formed separate compositions. Thus, the connection between the component carrier and the integral wall structure may be obtained without taking any further measures during the additive manufacturing of the wall structure, for instance carried out at the side of a component carrier manufacturer. The separate procedure of adhering a lid or the like on a component carrier on the side of a MEMS assembler is therefore dispensable.

According to an exemplary embodiment of the invention, an electronic device composed of a component carrier with an integrally formed wall structure surrounding fully or partially a mounting base for an electronic component is provided. Such an integrally formed wall structure is not attached from an exterior surface thereof onto the component carrier and is connected therewith by glue or the like, but it in contrast to this manufactured as one integral piece with the component carrier. By providing such a semifinished product, it is possible with very simple measures to mount, after forming the wall structure, an electronic component such as a microelectromechanical system on the mounting base which is then provisionally protected against mechanical damage by the integral wall structure. The component carrier with the integral wall structure can then be delivered, before surface mounting the electronic component on the mounting base, to a customer who simply needs to mount electronic components and optionally cap the mentioned semifinished product, i.e. after previously mounting of the electronic component on the component carrier at the customer side. The cumbersome procedure of wall formation and capping upon assembly may therefore be substituted by a simplified wall formation procedure which can be integrated properly into the component carrier manufacturing process. The mechanical integrity, sealing properties and stability of the component carrier with integral wall structure is significantly better than with the conventional approach of gluing a separate lid or the like to cover a MEMS on a PCB.

In the following, further exemplary embodiments of the method, the electronic device, and the panel will be explained.

In one embodiment, the wall structure may be made of an electrically insulating material. However, in another embodiment, the wall structure may be made of an electrically conductive material. Thus, the wall structure may also contribute to an electric function of the electronic device by selectively enabling or disabling propagation of an electric signal or electric power along the wall structure.

In an embodiment, the wall structure may be made of a reflow-resistant material. In other words, the wall structure may be made of a material which will not be deteriorated or damaged by the high temperatures (of for instance up to 260° C. or even up to 280° C.) which may occur during reflow soldering by which the electronic component(s) may be electrically connected and mechanically fixed to the mounting base(s). Examples for correspondingly appropriate temperature robust materials which may be hence used advantageously for the wall structure are FR4, polyimide, and many metallic materials.

In one embodiment, the wall structure may be made of an optically transparent material. However, in another embodiment, the wall structure may be made of an optically opaque material. Thus, the wall structure may also contribute to an optical function of the electronic device by selectively enabling or disabling propagation of electromagnetic radiation such as visible light through the wall structure.

In one embodiment, the wall structure has an upper opening being large enough for enabling mounting an electronic component on the mounting base after having formed the wall structure. In particular, shape and dimension of the upper opening may be adjusted so that it is mechanically possible to subsequently (i.e. after formation of the wall structure) guide an electronic component with a certain shape and dimension through the upper opening up to the mounting base. In such an embodiment, the wall structure formed (in particular directly) on the component carrier may be formed by a component carrier manufacturer (such as a PCB manufacturer). A resulting semifinished product of component carrier with mounting base and wall structure (but not yet having an electronic component mounted on the mounting base) may then be supplied for component assembly to another user for mounting an electronic component on the mounting base by guiding the electronic component through the upper opening on top of the wall up to the mounting base for completing the assembly procedure (for instance by soldering). Advantageously, wall formation may be thus integrated in component carrier formation and thus does not have to be carried out in a cumbersome way during component assembly.

In one embodiment of the electronic device, an electronic component is mounted on the mounting base. In another embodiment of the electronic device, no electronic component is mounted on the mounting base, although the wall structure is already present.

In view of the integral formation of the wall structure and the component carrier, an interface between wall structure and component carrier may be fluid-tight, sealed and inseparable (without damaging the electronic device) from one another.

The wall structure may, in one embodiment, fully circumferentially surround the entire mounting base and/or electronic component, i.e. may be a closed annular structure. In another embodiment, the wall structure may be also composed of a plurality of island-like separate wall structure sections which may be separated by gaps. Furthermore, the wall structure may be a single, continuous, but only partially surrounding structure surrounding only a part of the mounting base or electronic component.

In an embodiment, the wall structure is formed by additive manufacturing. In the context of the present application, the term "additive manufacturing" may particularly denote a manufacturing procedure of the integral wall structure according to which the wall structure is manufactured by the sequential addition of portions of material which, when taken together, constitute the wall structure. By such an additional manufacturing, stable and sealed formation of the wall structure is possible without the need to glue two components to one another.

In an embodiment, the wall structure is formed by three-dimensional printing of the wall structure on the component carrier. According to such an embodiment, the manufacture of the component carrier may be completed (for instance by carrying out PCB manufacturing procedures) before a 3D print head is activated or controlled to form the integral wall structure directly on the component carrier. Such a three-dimensional printing may be accomplished on the basis of powder which is solidified by for instance spatially limited thermal treatment, for example by a laser. It is also possible that a metallic wall structure is formed by sintering. Moreover, it is also possible that the wall structure is formed by ejecting droplets via a nozzle or the like for forming connected portions of the wall structure which are solidified when leaving the nozzle of the print head.

In an embodiment, the wall structure is formed by selectively solidifying a solidifiable liquid material on the component carrier. Such a solidifiable liquid material may be a hardenable polymer, for instance being liquid until being converted into a solid phase by a thermal impact or by an impact of electromagnetic radiation. The component carrier may be immersed in such a solidifiable liquid and definable volume portions of this liquid may be solidified in a spatially defined way by a spatially defined introduction of thermal energy.

In an embodiment, the solidifiable liquid material is hardened by a laser treatment. For example, a laser beam being the source of spatially highly concentrated thermal energy may be moved along the surface of the component carrier immersed in the solidifiable liquid, so that selectively in those spatial regions where the laser beam impinges on the surface of the component carrier, a first portion of the wall structure is formed by solidifiable liquid in this region. Subsequently, the position of the laser beam and/or of the component carrier may be moved to another position so that a next portion of the wall structure on the previously formed base portion of the wall structure is formed, and so on.

In an embodiment, the solidifiable material is a polymer solidifiable by irradiation with light (in particular by photopolymerization). The enthalpy properties of such a polymer may be specifically selected so that this polymer hardens or cures only when a certain amount of thermal energy, for instance provided by the above-mentioned laser, is exceeded in a specific volume of the liquid polymer.

In an embodiment, the wall structure is formed by solidifying a first portion of the solidifiable liquid material directly on the component carrier to thereby form a first portion of the wall structure, after the solidifying, lowering the component carrier (with or without electronic component) and the just formed first portion of the wall structure so that new liquid material fills the gap above the first portion of the wall structure, and after the lowering, solidifying a second portion of the solidifiable liquid material directly on the first portion of the wall structure to thereby form a second portion of the wall structure (see FIG. 10). By such a procedure, a surface portion of the solidifiable liquid, for instance an annular surface portion, is solidified before this solidified portion is lowered together with the component carrier before a subsequent annulus (or other shape) of the wall structure is formed after lowering. The height of the for example annular wall structure can then be freely defined by a corresponding selection of the number of lowering steps.

In an embodiment, the method further comprises mounting the electronic component (such a sensitive MEMS) on the mounting base so as to be protected by the wall structure. This procedure may be carried out preferably after the formation of the wall structure. However, the procedure may alternatively also be carried out prior to the formation of the wall structure on the electronic device, in particular on the component carrier.

In an embodiment, the method further comprises attaching a cap to the wall structure for capping an open top of the wall structure with regard to an environment after mounting the electronic component on the mounting base. The open top can be closed by the cap completely, for instance for hermetically sealing an interior of the lid formed by the cap and the wall structure. Alternatively, the open top can be closed only partially by the cap, for instance for protecting a microphone or loudspeaker as the electronic component which, during use, requires a vent hole for enabling propagation of acoustic waves between an interior and an exterior of the lid formed by the cap and the wall structure. The formation of a cap, for instance a flat sheet, on the semifinished electronic device can for example be accomplished on a customer side. Such a cap may be a simple plate attached to the top of the wall structure in a very simple processing step. It is also possible that by the formation of this cap, the functionality of the electronic component is extended. For example, the cap may form a functional part of the electronic component, for instance a MEMS. In one embodiment, the cap may comprise or consist of a lens forming part of an optical electronic component such as a camera module, a light sensor, etc. In another embodiment, the cap may comprise or consist of a flexible membrane or diaphragm (for instance of a piezoelectric material) which may also contribute to the function of a MEMS. Thus, the integral wall structure and the cap may either form a simply manufacturable lid for shielding the electronic component mounted on the mounting base under such a lid, or may be, together with or separately from the wall structure, functional part of the electronic component. For example, the cap may comprise a protective top plate (for protection against mechanical damage), a lens (for integrating also an optical functionality in the cap), and/or a membrane (for promoting a transfer of mechanical waves between an interior and an exterior of the cap).

In an embodiment, the method further comprises embedding a further electronic component in the component carrier and electrically connecting the further electronic component to the electronic component by at least part of the at least one electrically conductive layer structure. MEMS applications may involve a first surface mounted electronic component (such as a membrane type sensor or actuator), and an embedded electronic component (such as a controller chip) functionally cooperating with the surface mounted electronic component. In the described embodiment, the embedded electronic component may be embedded in the component carrier and may be electrically contacted with a surface mounted electronic component upon mounting the latter on the mounting base.

In an embodiment, the method is a method of manufacturing a plurality of electronic devices and comprises providing a plurality of mounting bases for mounting a plurality of electronic components on and/or in the component carrier, and integrally forming a plurality of wall structures with the component carrier prior to mounting electronic components on the mounting bases, each of the integrally formed wall structures at least partially surrounding a respective one of the mounting bases for mounting a respective one of the electronic components on the respective one of the mounting bases and protected by a respective one of the wall structures. Thus, the electronic devices may be formed in a batch procedure. This is a very efficient way of manufacturing a plurality of electronic devices in an at least partially simultaneous procedure. For example, many electronic components may be formed simultaneous or together on a panel level (in terms of the manufacture of the component carriers) and/or on wafer level (in terms of the manufacture of electronic components, which may be made on the basis of semiconductor technology). For example, many wall structures for many electronic components may be formed on a large component carrier (such as a panel) which is not yet in the dimension of a single electronic device only. This has the advantage that an additive manufacturing of the wall structures needs to be carried out only once for many electronic devices.

In an embodiment, the method further comprises singularizing the structure composed of the component carrier, the mounting bases and the wall structures into a plurality of sections constituting the electronic devices and each of which comprising a part of the component carrier, at least one of the mounting bases and at least one of the wall structures. Such a singularization may be carried out by sawing, laser cutting, etching or the like. The electronic components may be surface mounted on panel level or after singularization.

In an embodiment, the procedure of integrally forming the wall structure with the component carrier is carried out by a component carrier manufacturer (such as a PCB manufacturer) prior to shipping the component carrier with the mounting base and the integrally formed wall structure to an assembler (such as a chip or MEMS assembler) for subsequently mounting the electronic component on the mounting base so as to be protected by the wall structure. Thus, integrally forming the wall structure integrated in the PCB manufacturing process renders it unnecessary for an assembler to attach a lid or the like to a readily manufactured PCB. This is advantageous, since the formation of the wall structure at the end of a PCB manufacturing procedure has turned out to be significantly simpler from a technological point of view than its assembly during a MEMS assembly procedure.

In an embodiment, the wall structure extends up to a height higher than a height up to which the electronic component extends. By taking this measure, the sensitive electronic component may be protected by the vertically protruding wall structure.

In an embodiment, the electronic component is a microelectromechanical system (MEMS). Such a MEMS may be an actuator or a sensor. A MEMS may have a miniaturized movable element such as a membrane or a cantilever which can either be moved by an external impact (such as acoustic waves to be detected) or which may be moved by an electronic device internal stimulus (such as an electric signal applied to a piezoelectric membrane to oscillate for emitting acoustic waves in terms of a loudspeaker functionality). However, other actuator applications of the MEMS are possible as well, such as a micro-pump application, a micro-engine application, etc. In terms of sensing, the MEMS may also be a gas sensor capable of detecting certain gases from an environment. However, what is common for MEMS applications is that the sensitive MEMS needs protection against mechanical impact and/or chemical impact from the environment. In this context, the wall structure may provide its contribution.

In an embodiment, the electronic device is a semiconductor chip (such as an ASIC, application-specific integrated circuit). It is also possible that the electronic component comprises or consists of a diode such as a light emitting diode (LED), for instance when the electronic device is configured as a proximity sensor (in particular for detecting an approaching body such as a human being).

In an embodiment, the wall structure is integrally formed with the component carrier. Thus, the connection between the wall structure and the rest of the electronic device may be accomplished at a position of the component carrier. In order to reduce reliability issues resulting from thermal stress in the presence of temperature cycles during normal use of the electronic device, it is possible that the material of the component carrier and of the wall structure is made with a similar or the same coefficient of the thermal expansion. It is furthermore possible that the wall structure is manufactured of the same material as the component carrier. Material bridges can therefore be omitted.

In an embodiment, the wall structure is integrally formed on printed circuit board material of the component carrier. In particular, the wall structure can be integrally formed with electrically insulating material of the PCB, for instance prepreg or FR4. For instance in a scenario in which the wall structure is made of an electrically conductive material (for instance for purposes of electromagnetic shielding, electric grounding, or the provision of another electronic functionality), it is also possible to mount the wall structure on electrically conductive material of the PCB such as copper).

In an embodiment, the at least one electrically insulating layer structure comprises at least one of the group consisting of resin, in particular Bismaleimide-Triazine resin, cyanate ester, glass, in particular glass fibers, prepreg material, polyimide, liquid crystal polymer, epoxy-based Build-Up Film, FR4 material, a ceramic, and a metal oxide. Although prepreg or FR4 are usually preferred, other materials may be used as well.

In an embodiment, the at least one electrically conductive layer structure comprises at least one of the group consisting of copper, aluminum, and nickel. Although copper is usually preferred, other materials are possible as well.

In an embodiment, the component carrier is shaped as a plate. The component carrier may hence be shaped like a sheet and may be for instance embodied as a laminate type component carrier.

In an embodiment, the component carrier is configured as one of the group consisting of a printed circuit board, and a substrate.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "substrate" may particularly denote a small component carrier having substantially the same size as an electronic component to be mounted thereon.

In an embodiment, the surface mounted electronic component and/or at least one further electronic component embedded in the component carrier comprises or comprise an electronic component selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other electronic components may be surface mounted and/or embedded in the electronic device. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element.

In an embodiment, the component carrier is a laminate-type component carrier. In such an embodiment, the component carrier is a compound of multiple layer structures which are stacked and connected together by applying a pressing force, if desired accompanied by heat. Thus, the component carrier may be formed by stacking a plurality of layer structures and connecting them by the application of mechanical pressure and thermal energy (i.e. heat).

BRIEF DESCRIPTION OF THE DRAWINGS

The invention will be described in more detail hereinafter with reference to examples of embodiment but to which the invention is not limited.

DETAILED DESCRIPTION OF EXEMPLARY EMBODIMENTS

Figure 1:
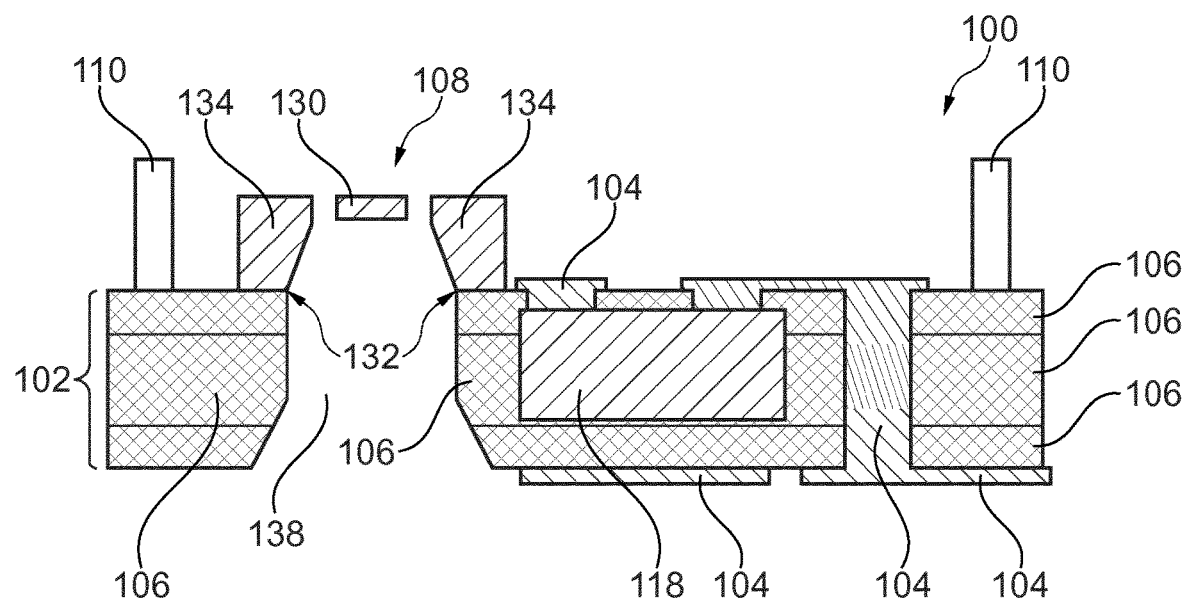
FIG. 1 shows a cross-sectional view of an electronic device with a mounted MEMS and an integrated wall structure according to an exemplary embodiment of the invention.

The described aspects and further aspects of the method for manufacturing an electronic device, an electronic device and a panel are apparent from the illustrated examples to be described hereinafter and are explained with reference to these example embodiments.

The illustrations in the drawings are schematically presented. In different drawings, similar or identical elements are provided with the same reference signs.

FIG. 1 shows a cross-sectional view of an electronic device 100 according to an exemplary embodiment of the invention with a mounting base 132 defining a mounting surface of component carrier 102, embodied as PCB, for mounting (for instance by soldering) an electronic component 108, embodied as a MEMS (microelectromechanical system), thereon. The shown electronic device 100 also comprises an integrated wall structure 110, forming an integral body together with the component carrier 102. Although not shown in detail in the figures, one or more electric contact structures such as pads (which may be covered by solder pads) may be provided at the mounting base 132 for electrically contacting electronic component 108 to be mounted thereon. Furthermore and although also not shown in detail in the figures, one or more mechanical contact structures such as mounting holes may be optionally provided at the mounting base 132 for mechanically mounting and fixing electronic component 108 to be mounted thereon.

The electronic device 100 comprises plate-shaped and laminate type component carrier 102 which is here embodied as printed circuit board (PCB). The component carrier 102 is hence configured as a laminate of electrically conductive layer structures 104 and electrically insulating layer structures 106. The electrically conductive layer structures 104 are embodied as patterned electrically conductive layers interconnected with vias as vertical interconnect structures. In the shown embodiment, the electrically conductive layer structures 104 are made of copper. The electrically insulating layer structures 106 are continuous or patterned layers comprising resin (such as epoxy resin) with embedded fibers (in particular glass fibers), in particular may be made of prepreg or FR4 material.

In the scenario shown in FIG. 1, a MEMS microphone (alternatively a MEMS loudspeaker), as electronic component 108, comprises a piezoelectric membrane 130 supported by a support structure 134 and is surface mounted on the component carrier 102, more specifically on the mounting base 132. Below the piezoelectric membrane 130, the component carrier 102 has a through hole 138 for enabling an air exchange between the lower surface of the piezoelectric membrane 130 and an environment. The mounting base 132 is a surface portion of the electronic device 100 at which also electrically conductive material of the electrically conductive layer structures 104 is exposed so that one or more electric contacts of the electronic component 108 are automatically contacted with the mentioned electrically conductive material when being mechanically mounted on the mounting base 132. Via this electrically conductive material and further electrically conductive material of the electrically conductive layer structures 104, the surface mounted electronic component 108 can be electrically coupled with a further embedded electronic component 118, for instance a semiconductor chip for processing acoustic signals sensed by the MEMS microphone (alternatively for controlling the MEMS loudspeaker for emitting acoustic waves). Alternatively, the further electronic component 118 may also be surface mounted on the component carrier 102.

As can be taken from FIG. 1, the electronic device 100 also comprises annular wall structure 110 integrally formed with the electronic device 100 and fully circumferentially surrounding the electronic component 108. As can be taken from FIG. 1 as well, the wall structure 110 has an upper opening being large enough for enabling mounting an electronic component 108 on the mounting base 132 after having formed the wall structure 110. In other words, the electronic component 108 may be lowered from an upper side of the electronic device 100 and may be guided through the upper opening up to the mounting base 132 so as to enable component mounting after wall formation. Integrally forming the wall structure 110 with the component carrier 102 can be accomplished by carrying out an additive manufacturing procedure, in particular by three dimensionally printing the wall structure 110 on the PCB surface or by carrying out a procedure as the one described referring to FIG. 10. Hence, PCB manufacturing may comprise procedures of laminating electrically conductive and electrically insulating sheets, patterning at least part of the sheets, drilling (for instance laser drilling or mechanically drilling) through holes and filling them with copper for via formation, optionally embedding a further electronic component 118, forming a surface finish such as ENIG, etc. Directly after completion of this PCB manufacturing process, the additive manufacturing procedure of forming the wall structure 110 may be carried out. In a specific embodiment of FIG. 1, the integral formation of the wall structure 110 with the component carrier 102 occurs on PCB material. The wall structure 110 extends up to a vertical height higher than a height up to which the electronic component 108 extends in the vertical direction according to FIG. 1. Thus, the annular wall structure 110 not only mechanically protects the sensitive electronic component 108 from the lateral position, but also vertically (in particular after having attached a cap 200, as shown in FIG. 2).

Figure 2:
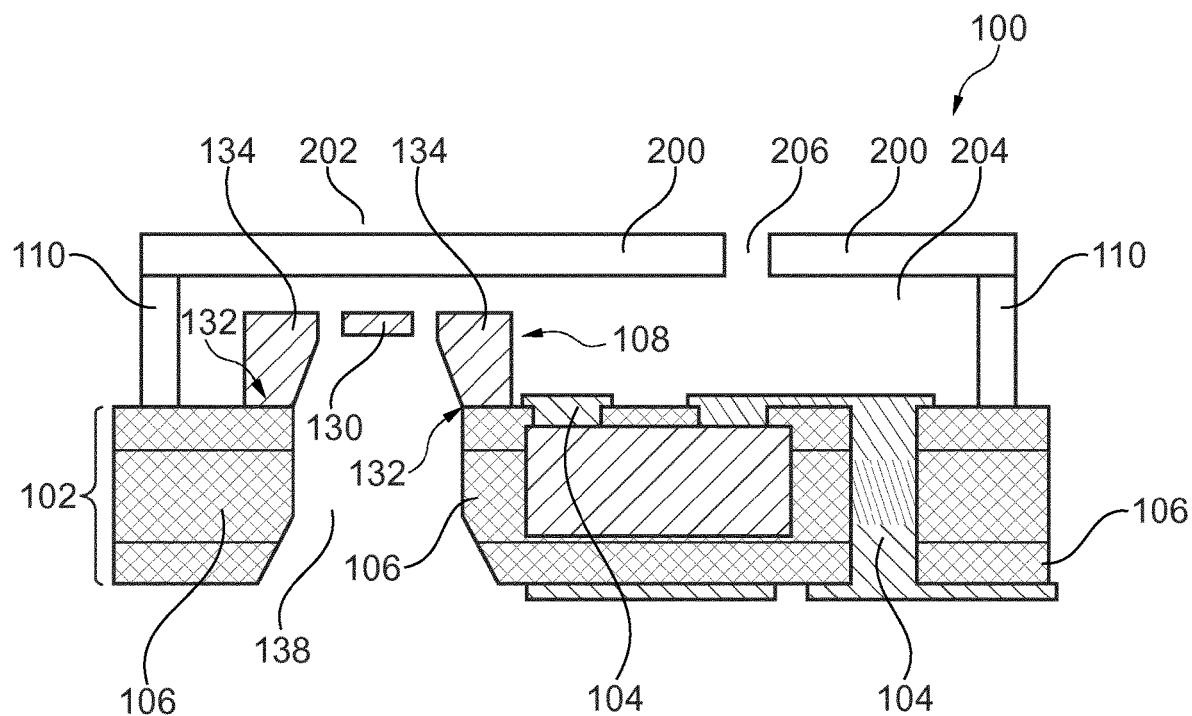
FIG. 2 shows a cross-sectional view of the electronic device of FIG. 1 with a cap on the wall structure over the MEMS.

FIG. 2 shows a cross-sectional view of the electronic device 100 of FIG. 1 with cap 200 on the wall structure 110 over the electronic component 108 which is here configured as a MEMS.

Hence, the electronic device 100 further comprises cap 200, here embodied as a flat plate, attached for partially capping an open top of the wall structure 110 with regard to an environment 202. In order to enable acoustic communication between an exterior 202 and an interior 204 of the cup shaped cover formed by the cap 200 and the wall 110, a through hole 206 is formed in the cap 200.

As can be taken from FIG. 2, the manufacture of the electronic device 100 can be completed by simply attaching a cap 200 on the annular wall structure 110 to hermetically enclose the MEMS type electronic component 108 therein. However, as can be taken from FIG. 2, through hole 206 is formed in the cap 200 to promote an exchange of acoustic waves between membrane 130 of the MEMS type electronic component 108 and the external environment 202. By already providing the wall structure 110 on a PCB manufacturer side, the surface mounting of the electronic component 108, as well as, the formation of the cap are significantly simplified on behalf of the MEMS customer.

The electronic device 100 shown in FIG. 1 is a PCB with a MEMS microphone mounted thereon. Since the MEMS type electronic component 108 needs protection due to its mechanically highly sensitive piezoelectric membrane 130, the integrally formed wall structure 110 is already provided on the side of the PCB manufacturer. Thus, a semifinished product composed of the component carrier 102, manufactured in PCB technology, and the wall structure 110 integrally formed with this by three-dimensional printing or the like may be delivered to a customer specialized in MEMS technology. Such a customer may then surface mount the MEMS type electronic device 108 on the mounting base 132 of the component carrier 102 to obtain the electronic device 100 shown in FIG. 1.

Figure 3:
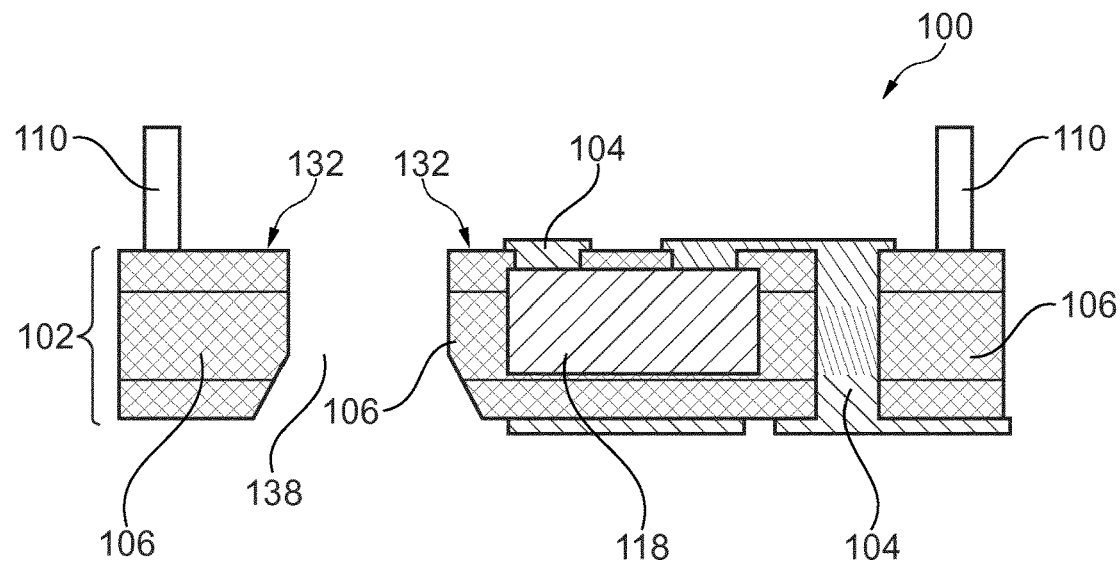
FIG. 3 shows a cross-sectional view of an electronic device with an integrated wall structure according to still another exemplary embodiment of the invention, but without an electronic component being yet mounted on the mounting base.

FIG. 3 shows a cross-sectional view of an electronic device 100 with an integrated wall structure 110 according to still another exemplary embodiment of the invention. The embodiment of FIG. 3 differs from the embodiment of FIG. 1 in that, according to FIG. 3, the electronic component 108 is not yet surface mounted on the mounting base 132. Hence, the electronic component 100 as shown in FIG. 3 may be the final product as manufactured by a PCB manufacturer, as it can be shipped to an assembly user operating a pick-and-place machine for surface mounting the electronic component 108 on the mounting base 132. According to the described embodiment, in contrast to conventional approaches, the integrated wall structure 110 has already been manufactured by the PCB manufacturer, which is easily integratable into the PCB manufacturing procedure. In contrast to this, on the assembly side, attaching a lid after having mounted the electronic component 108 on the mounting base 132 is a cumbersome and difficult process. It is much easier that the wall structure 110 is integrally formed with the component carrier 102 by a PCB manufacturer, and therefore prior to shipping the electronic device 100 according to FIG. 3 to the assembly user for subsequent placement of the electronic component 108 on the mounting base 132.

FIG. 3 hence shows an embodiment in which the electronic device 100 is a semifinished product of component carrier 102 and integral wall structure 110 without the electronic device 108 being already mounted on the mounting base 132. Surface mounting the electronic device 108 and capping the wall structure 110 may then be tasks carried out at a MEMS side customer.

Figure 4:
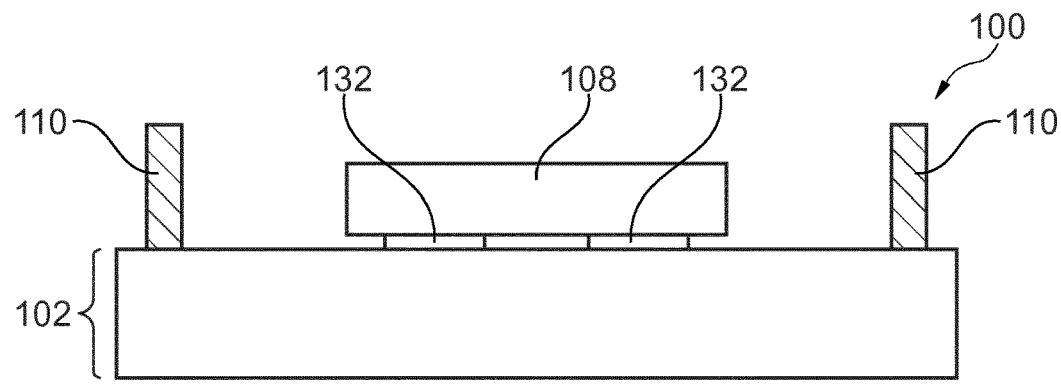
FIG. 4 shows a cross-sectional view of an electronic device with a mounted MEMS and an integrated wall structure according to yet another exemplary embodiment of the invention.
Figure 5:
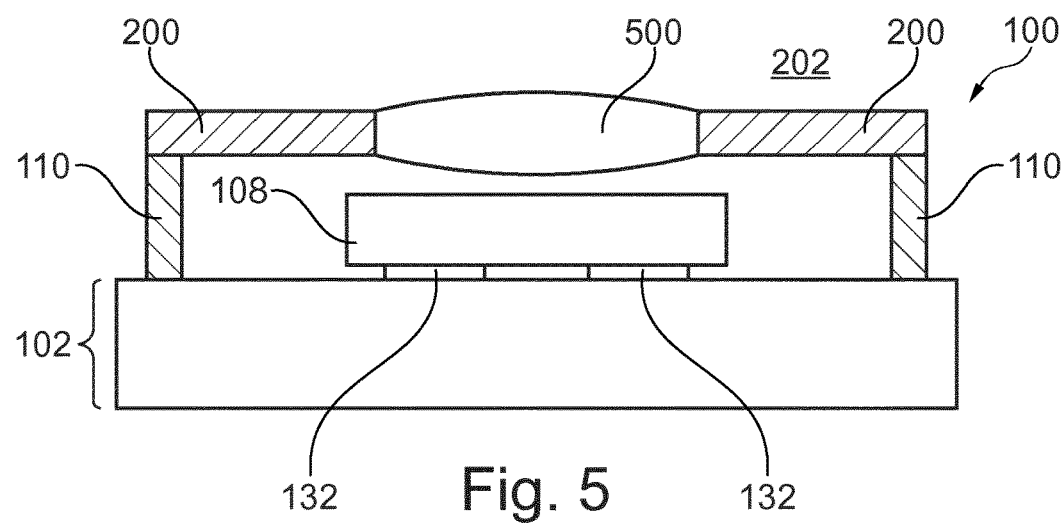
FIG. 5 shows a cross-sectional view of the electronic device of FIG. 4 with a cap with an integrated lens on the wall structure over the MEMS.

FIG. 4 shows a cross-sectional view of an electronic device 100 with a mounted MEMS and an integrated wall structure 110 according to yet another exemplary embodiment of the invention. FIG. 5 shows a cross-sectional view of the electronic device 100 of FIG. 4 with a cap 200 with an integrated lens 500 on the wall structure 110 over the MEMS.

FIG. 4 shows an embodiment in which the integral wall structure 110 is formed on a component carrier 102 having already surface mounted thereon an electronic component 108 in form of a surface mounted camera module. In this embodiment, capping the electronic device 100 shown in FIG. 4 also involves, see FIG. 5, attaching lens 500 as part of the cap 200. The lens 500 then focuses electromagnetic radiation from the environment 202 onto the camera module as the electronic component 108, during operation of the electronic device 100.

The following description referring to FIG. 6 to FIG. 9 illustrates that integral wall formation by additive manufacturing in the framework of PCB manufacture can be carried out on panel level or wafer level further simplifying and accelerating the manufacturing procedure.

Figure 6:
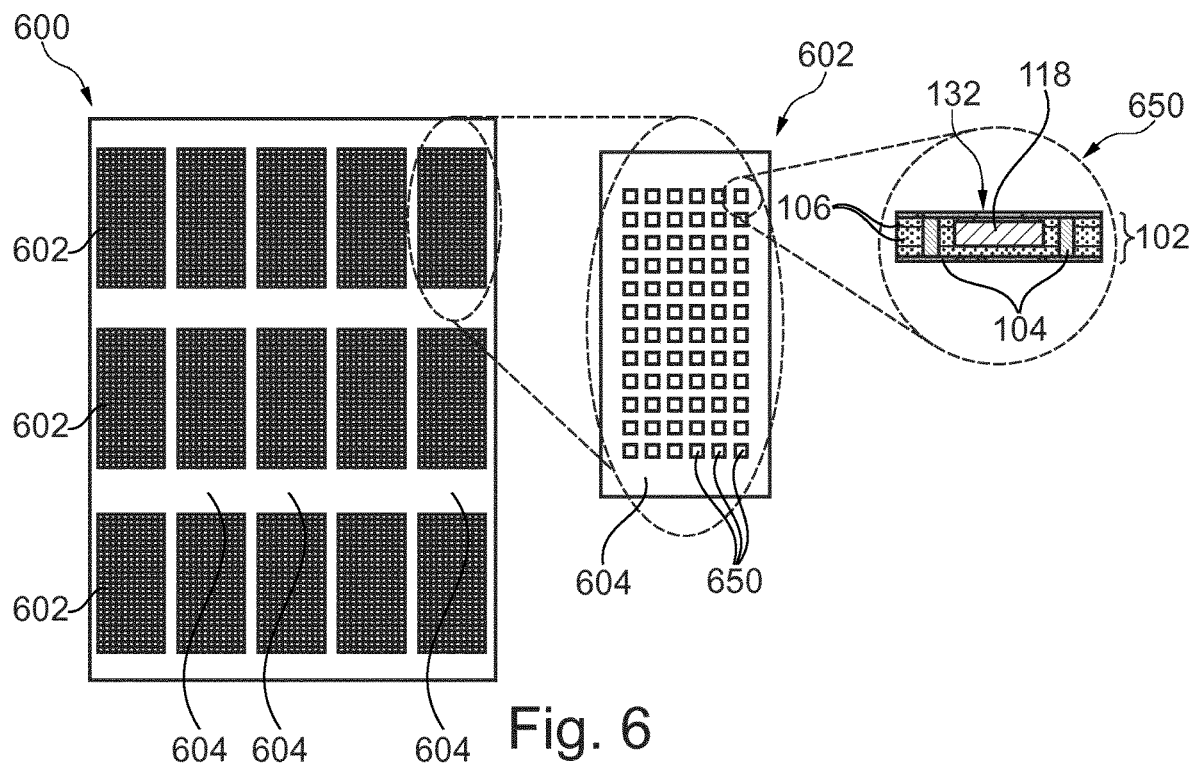
FIG. 6 shows different views of a panel comprising a plurality of pre-forms of electronic devices according to an exemplary embodiment.

FIG. 6 shows different views of a panel 600 comprising a plurality of pre-forms 650 of electronic devices 100 (shown in FIG. 7) according to an exemplary embodiment.

On the processed printed circuit board panel 600, a plurality of sections 602 are formed which are arranged in rows and columns, i.e. in a matrix-like pattern. Between subsequent sections 602, respectively inactive areas 604 are formed. In each of the sections 602, a plurality of component carrier structures or pre-forms 650 are formed, in turn, in a matrix-like pattern, i.e. also in rows and columns. A detail shown in FIG. 6 shows the detailed construction of a pre-form 650. In particular, each of the pre-forms 650 is equipped with a mounting base 132 each for mounting an electronic device 108 such as a MEMS. FIG. 6 is hence indicative of a batch procedure of manufacturing electronic devices 100 according to exemplary embodiments of the invention.

Figure 7:
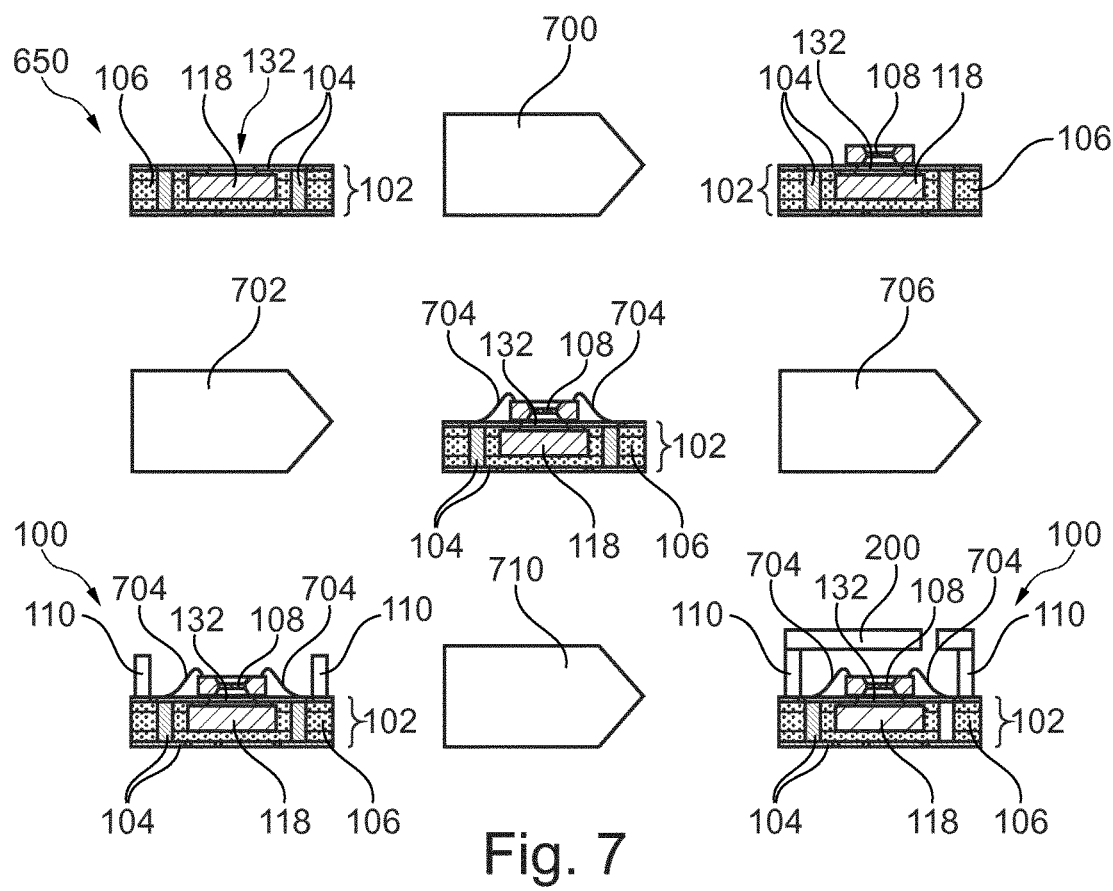
FIG. 7 shows different structures obtained during further processing a pre-form according to FIG. 6 for manufacturing an electronic device according to an exemplary embodiment of the invention.

FIG. 7 shows different structures obtained during further processing a respective pre-form 650 according to FIG. 6 for manufacturing an electronic device 100 according to an exemplary embodiment of the invention.

As can be taken from FIG. 7, after singularizing the individual component carriers 102 from the panel 600 shown in FIG. 6, it is possible to then surface mount the electronic device 108, see procedural step 700. As can be taken from the subsequent procedural step 702, bond wires 704 are then formed for connecting the electronic component 108 with the component carrier 102. As can be taken from a procedural step 706, the wall structures 110 are then integrally formed, for instance by additive manufacturing. As can be taken from a procedural step 710, a cap 200 is then attached to a circumferential upper surface of the integral wall structure 110.

Figure 8:
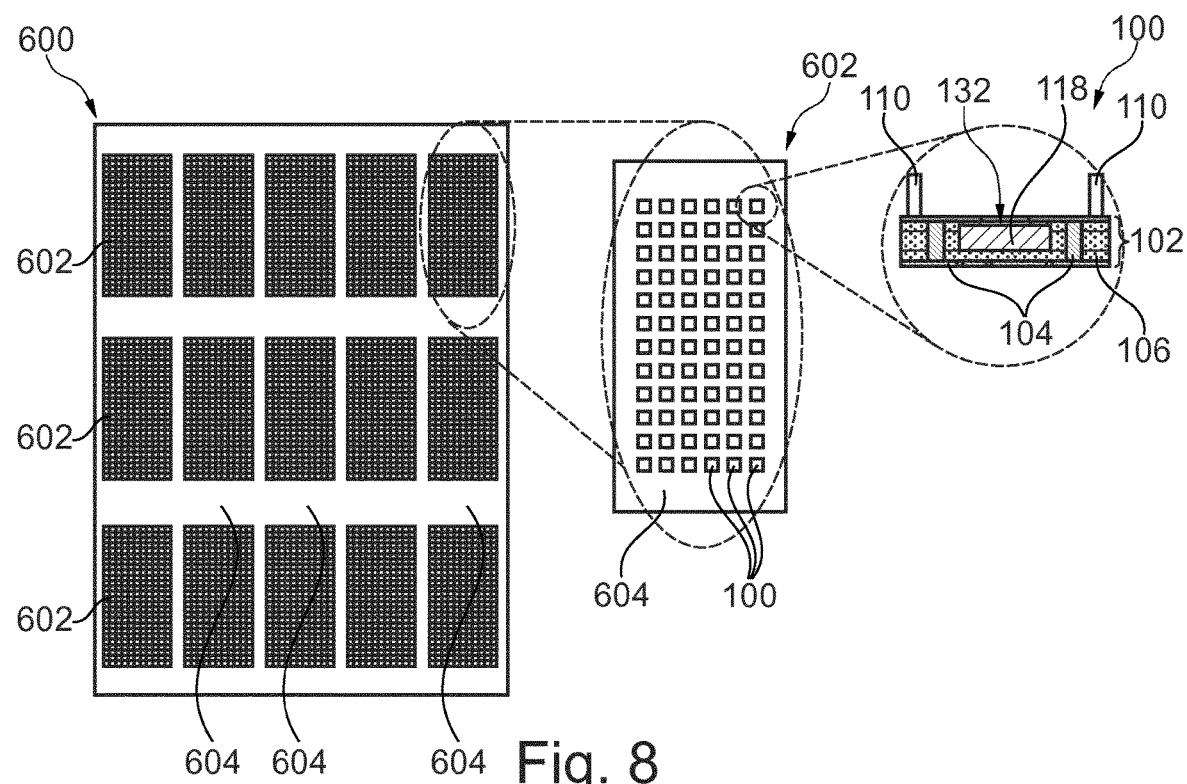
FIG. 8 shows different views of a panel comprising a plurality of electronic devices with integrated wall structures according to an exemplary embodiment.

FIG. 8 shows different views of a panel 600 comprising a plurality of electronic devices 100 with integrated wall structures 110 according to an exemplary embodiment.

The embodiment of FIG. 8 differs from the embodiment of FIG. 6 and FIG. 7 in that the integral wall structures 110 are already formed, by additive manufacturing, on panel level. However, the electronic components 108 are not yet mounted on the mounting bases 132 according to FIG. 8. This means that the integral wall structures 110 are already formed on the various component carriers 100 before they are singularized from the panel 600. At the time of singularizing the panel 600 of FIG. 8, the electronic devices 100 according to FIG. 8 still do not yet have, surface mounted thereon, the electronic components 108 on the mounting bases 134. Panel 600 according to FIG. 8 may be subsequently singularized into the individual electronic components 100.

Figure 9:
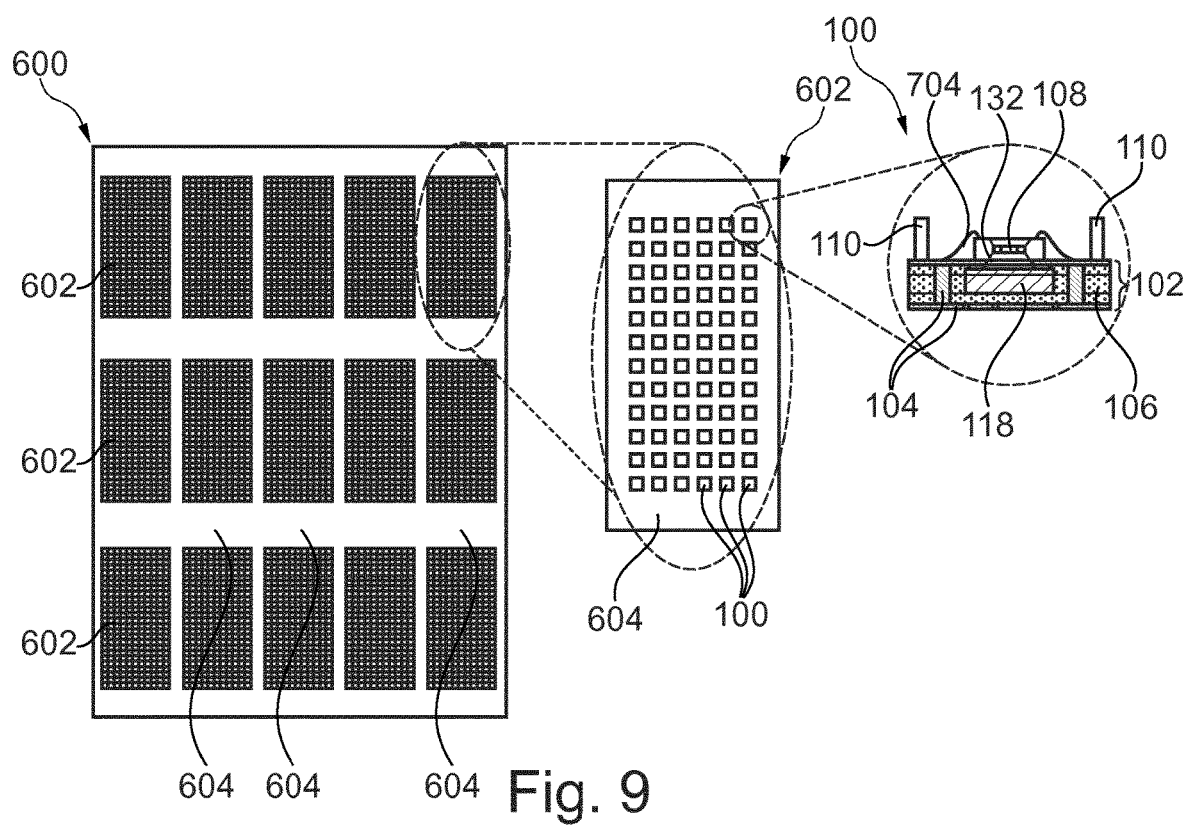
FIG. 9 shows different views of a panel comprising a plurality of electronic devices with integrated wall structures and mounted MEMS according to an exemplary embodiment.

FIG. 9 shows different views of a panel 600 comprising a plurality of electronic devices 100 with integrated wall structures 110 and mounted MEMS as electronic components 108 according to another exemplary embodiment. The embodiment of FIG. 9 differs from the embodiment of FIG. 8 in that, already on panel level, the electronic components 108 are mounted on the mounting bases 134, before singularizing.

Figure 10:
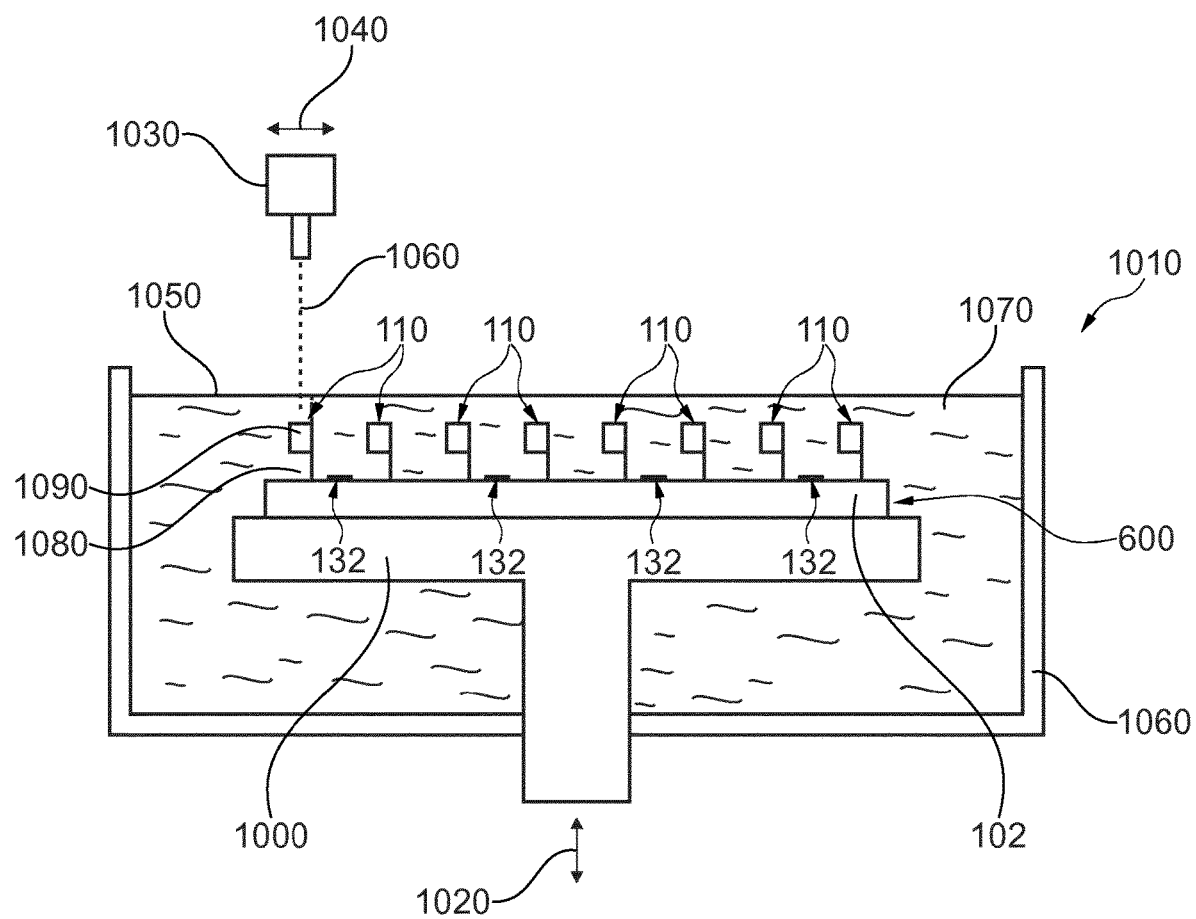
FIG. 10 illustrates an apparatus for and a method of manufacturing an electronic device with integrated wall structure using additive manufacturing according to an exemplary embodiment of the invention.

FIG. 10 illustrates a method of manufacturing a batch of electronic devices 100 with integrated wall structures 110 using additive manufacturing according to an exemplary embodiment of the invention.

According to FIG. 10, a component carrier 102 on panel level (for in-stance a PCB panel) is provided and mounted on a movable (see reference numeral 1020) platform or support 1000 of a manufacturing apparatus 1010 according to an exemplary embodiment of the invention. Both the component carrier 102 and the support 1000 are immersed in a bath of a liquid polymer 1070 within a container 1060. In other embodiments, the wall structure may be formed based on a powdery or granulate material (for instance polymer material). Definable portions of the liquid polymer 1070 can be solidified by treatment with a movable (see reference numeral 1040) laser 1030, as will be explained in the following in further detail. Based on a plurality of subsequent solidification procedures, a plurality of wall structures 110 (each assigned to a respective one of a plurality of electronic devices 100 to be manufactured in the described batch procedure) can be formed by additive manufacturing. After having mounted electronic components 108 on singularized or still connected electronic devices 100, the wall structures 110 (which may be rings) may surround and thereby protect the electronic components 108 (for instance sensitive MEMS devices). Hence, the wall structures 110 may be formed by photopolymerization according to FIG. 10. However, in other embodiments of the invention, the wall structures 110 of the electronic devices 100 can also be manufactured by other additive manufacturing procedures, such as three-dimensional printing.

An exemplary procedure of manufacturing the wall structures 110 ac-cording to FIG. 10 is as follows: Firstly, the support 1000 is located at a first height position at which the component carrier 102 is only slightly beneath the fluid level 1050 of the solidifiable liquid material 1070. In this configuration, a first portion of the solidifiable liquid material 1070 directly on the component carrier 102 is hardened or solidified by laser treatment to thereby form a first portion 1080 of the wall structures 110. The first portion to be solidified may be specifically selected by a volume of the solidifiable liquid material 1070 which is irradiated with laser beam 1060. After this solidifying, the component carrier 102 and the first portions 1080 of the wall structure 110 integrally connected with the component carrier 102 are lowered by lowering movable support 1000 so that new liquid material of the solidifiable liquid material 1070 fills a gap above the first portion 1080 of the wall structure 110. After the lowering, a corresponding second portion of the solidifiable liquid material 1070 directly on the first portion 1080 of the wall structure 110 is solidified by a corresponding treatment with the laser 1030 to thereby form a second portion 1090 (integrally connected with the first portion 1080) of the wall structure 110. This procedure of lowering and solidifying can be repeated a desired number of times until the formed wall structure 110 has a desired height and shape. When the integral formation of the wall structures 110 on the component carrier 102 is completed, component carrier 102 together with wall structures 110 may be removed from the container 1060, may be cleaned, and may then be further processed. Further processing may involve singularization of the manufactured body into a plurality of electronic components 100. Later on, electronic components 108 may be surface mounted on the individual electronic devices 100.

FIG. 10 therefore shows a platform on which the panel 600 or master component carrier 102 is placed. The platform together with the panel 600 are then placed in container 1060 filled with the solidifiable polymeric liquid 1070. Laser 1030, which may be controlled by a control device (not shown), then scans the surface of the panel 600 and emits electromagnetic laser beam 1060 which firstly solidifies first portion 1080 of the integral wall structures 110 to be formed. Subsequently, the platform with the panel 600 and the first portions 1060 is lowered as a basis for the subsequent formation of the second portions 1090, and so on. After having completed this manufacturing procedure, the panel 600 with the integral wall structures 110 is cleaned and dried and is subsequently singularized into the various electronic devices 100.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing an electronic device, the method comprising:
providing a component carrier, being a printed circuit board or an IC substrate, comprising a laminate of at least one electrically conductive layer structure and at least one electrically insulating layer structure;
providing a mounting base for mounting an electronic component on and/or in the component carrier;
integrally forming a wall structure with the component carrier prior to mounting an electronic component on the mounting base, the integrally formed wall structure at least partially surrounding the mounting base for mounting the electronic component on the mounting base and protected by the wall structure;
wherein the wall structure is formed by additive manufacturing, wherein the wall structure is formed by selectively solidifying a solidifiable material on the component carrier by photopolymerization.

2. The method according to claim 1, wherein the solidifiable material is solidified by a laser treatment.

3. The method according to claim 1, wherein the solidifiable material comprises a polymer.

4. The method according to claim 1, wherein the wall structure is formed by:
solidifying a first portion of the solidifiable material directly on the component carrier to thereby form a first portion of the wall structure;

after the solidifying, moving the component carrier with the first portion of the wall structure so that new material fills a gap on the first portion of the wall structure;

after the moving, solidifying a second portion of the solidifiable material directly on the first portion of the wall structure to thereby form a second portion of the wall structure.

5. The method according to claim 1, wherein the method further comprises, after having formed the wall structure, mounting the electronic component on the mounting base and protected by the wall structure.

6. The method according to claim 5, wherein the method further comprises attaching, after forming the wall structure and after mounting the electronic component on the mounting base, a cap for capping at least part of an open top of the wall structure with regard to an environment.

7. The method according to claim 1, wherein the method further comprises embedding a further electronic component in the component carrier and electrically connecting the further electronic component to the electronic component by at least part of the at least one electrically conductive layer structure.

8. The method according to claim 1, wherein the method is a method of manufacturing a plurality of electronic devices and comprises:

providing a plurality of mounting bases for mounting a plurality of electronic components on and/or in the component carrier;

integrally forming a plurality of wall structures with the component carrier prior to mounting electronic components on the mounting bases, each of the integrally formed wall structures at least partially surrounding a respective one of the mounting bases for mounting a respective one of the electronic components on the respective one of the mounting bases and protected by a respective one of the wall structures.

9. The method according to claim 8, wherein the method further comprises singularizing a structure comprising the component carrier, the mounting bases and the wall structures into a plurality of sections constituting the electronic devices and each of which comprising a part of the component carrier, at least one of the mounting bases and at least one of the wall structures.

10. The method according to claim 1, wherein the procedure of integrally forming the wall structure with the component carrier is carried out by a component carrier manufacturer prior to shipping the component carrier with the mounting base and the integrally formed wall structure to an assembler for subsequently mounting the electronic component on the mounting base and protected by the wall structure.

11. A method of manufacturing an electronic device, the method comprising:

providing a component carrier, being a printed circuit board or an IC substrate, comprising a laminate of at least one electrically conductive layer structure and at least one electrically insulating layer structure;

providing a mounting base for mounting an electronic component on and/or in the component carrier;

integrally forming a wall structure with the component carrier in a single step prior to mounting an electronic component on the mounting base, the integrally formed wall structure at least partially surrounding the mounting base for mounting the electronic component on the mounting base and protected by the wall structure;

wherein the wall structure is formed by additive manufacturing, wherein the wall structure is formed by three-dimensionally printing the wall structure on the component carrier.

* * * * *